(12) United States Patent
Wirth

(10) Patent No.: US 9,214,591 B2
(45) Date of Patent: Dec. 15, 2015

(54) SECURING DEVICE FOR SOLAR CELLS AND METHOD FOR SECURING SOLAR CELLS

(75) Inventor: Harry Wirth, Merzhausen (DE)

(73) Assignee: Fraunhofer-Gesellschaft zur Förderung der angewandten Forschung e.V. (DE)

( * ) Notice: Subject to any disclaimer, the term of this patent is extended or adjusted under 35 U.S.C. 154(b) by 314 days.

(21) Appl. No.: 13/808,791

(22) PCT Filed: Jul. 7, 2011

(86) PCT No.: PCT/EP2011/003384
§ 371 (c)(1),
(2), (4) Date: Jan. 28, 2013

(87) PCT Pub. No.: WO2012/003986
PCT Pub. Date: Jan. 12, 2012

(65) Prior Publication Data
US 2013/0125380 A1    May 23, 2013

(30) Foreign Application Priority Data
Jul. 7, 2010   (DE) .......................... 10 2010 026 338

(51) Int. Cl.
*H01L 31/18* (2006.01)
*H01L 31/048* (2014.01)
(Continued)

(52) U.S. Cl.
CPC ................ *H01L 31/18* (2013.01); *B23Q 3/088* (2013.01); *B32B 17/10018* (2013.01); *B32B 17/10972* (2013.01); *B32B 37/003* (2013.01);
(Continued)

(58) Field of Classification Search
CPC ..... B23P 11/00; B23P 2700/12; B23Q 3/088; B23Q 2703/04; B29L 2009/00; B29L 2009/003; B29L 2009/005; B32B 17/10018; B32B 17/10972; B32B 37/003; B32B 2457/12; H01L 31/048; H01L 31/18; Y10T 29/49355; Y10T 29/49998
See application file for complete search history.

(56) References Cited

U.S. PATENT DOCUMENTS 3,652,075 A * 3/1972 Thompson ...................... 269/21
4,554,038 A * 11/1985 Allard ............................. 156/196
(Continued)

FOREIGN PATENT DOCUMENTS

| CN | 1202740 | 12/1998 |
| CN | 101351897 | 1/2009 |

(Continued)

OTHER PUBLICATIONS

"International Application No. PCT/EP2011/003384, International Search Report and Written Opinion dated Oct. 4, 2011", 13 pgs.
(Continued)

*Primary Examiner* — David Bryant
*Assistant Examiner* — Matthew P Travers
(74) *Attorney, Agent, or Firm* — Schwegman Lundberg & Woessner, P.A.

(57) ABSTRACT

The invention relates to a device for securing solar cells to glass surfaces, the securing device comprising a film of encapsulation material containing a plurality of holes and troughs in the film surface. Solar cells disposed on the film can be secured to a glass surface as a result of a vacuum being generated in the troughs and holes. The invention also relates to a method for securing solar cells in solar module production.

15 Claims, 4 Drawing Sheets

(51) Int. Cl.
   *B32B 17/10*   (2006.01)
   *B23Q 3/08*    (2006.01)
   *B32B 37/00*   (2006.01)

(52) U.S. Cl.
   CPC .......... *H01L31/048* (2013.01); *B23Q 2703/04* (2013.01); *B32B 2457/12* (2013.01); *Y02E 10/50* (2013.01); *Y10T 29/49355* (2015.01); *Y10T 29/49998* (2015.01)

(56) References Cited

U.S. PATENT DOCUMENTS

| | | | |
|---|---|---|---|
| 5,335,405 A * | 8/1994 | Ammann et al. | 29/407.1 |
| 5,572,786 A * | 11/1996 | Rensch | 29/559 |
| 5,968,287 A | 10/1999 | Nath | |
| 6,254,090 B1 * | 7/2001 | Rhodes et al. | 271/276 |
| 8,247,681 B2 | 8/2012 | Reinisch | |
| 8,253,009 B2 | 8/2012 | Reinisch | |
| 8,336,188 B2 * | 12/2012 | Monteen et al. | 29/559 |
| 8,833,746 B2 * | 9/2014 | Cone et al. | 269/21 |
| 2009/0067114 A1 * | 3/2009 | Balan | 361/234 |
| 2009/0230176 A1 * | 9/2009 | Takahashi | 228/256 |
| 2011/0162694 A1 | 7/2011 | Kalmbach et al. | |
| 2013/0087273 A1 * | 4/2013 | Stehmeier et al. | 156/247 |

FOREIGN PATENT DOCUMENTS

| | | |
|---|---|---|
| DE | 102006007447 A1 | 7/2007 |
| DE | 102007010710 | 9/2008 |
| DE | 102008046328 A1 | 3/2010 |
| EP | 0 877 427 A2 | 11/1998 |
| WO | WO-2008104596 A1 | 9/2008 |
| WO | WO-2009/108832 | 9/2009 |

OTHER PUBLICATIONS

"German Application No. 10 2010 026 338.9, Office Action mailed Mar. 30, 2011", 12 pgs.

"International Application No. PCT/EP2011/003384, International Preliminary Report on Patentability mailed Jan. 17, 2013", 10 pgs.

"Chinese Application No. 201180033375.2, Notification of the First Office Action dated Nov. 26, 2014", [with English translation], 12 pgs.

* cited by examiner

SECURING DEVICE FOR SOLAR CELLS AND METHOD FOR SECURING SOLAR CELLS

PRIORITY CLAIM TO RELATED APPLICATIONS

This application is a national stage application under 35 U.S.C. §371 of PCT/EP2011/003384, filed Jul. 7, 2011, and published as WO 2012/003986 A1 on Jan. 12, 2012, which claims priority to German Application No. 10 2010 026 338.9, filed Jul. 7, 2010, which applications and publication are incorporated by reference as if reproduced herein and made a part hereof in their entirety, and the benefit of priority of each of which is claimed herein.

TECHNICAL FIELD

The invention relates to a securing device for solar cells on glass surfaces, the securing device comprising a film which has a large number of holes and troughs on the film surface. By producing a low pressure in the troughs and holes, securing of solar cells situated thereon to a glass surface can then be effected. The invention likewise relates to a method for securing solar cells in the production of solar modules.

BACKGROUND

In the state of the art, solar modules are produced by the solar cells being connected electrically in series to form so-called cell strings and being laminated between the front glass, an encapsulating material and a rear-side film.

In the production of photovoltaic modules, the solar cells should experience as little mechanical stress as possible. Any lifting and depositing of the solar cells, in particular in the already connected string, increases the risk of breakage.

Solar cells with a contact arrangement on both sides are connected to form strings in a first step and then deposited as a string on the stack made of glass and encapsulating material. For rear contact cells, processes which provide direct deposition of the cells on the stack made of glass and encapsulating material are known. In order that the cells do not bulge or become displaced, glueing of the cells to the encapsulating material is provided. For this purpose, the cell must be heated. During glueing, air bubbles can thereby be included in the encapsulating material. Glueing thereby requires adhesion which cannot be achieved for all cell surfaces. In the case of bulging of the solar cell, the result can thus be detachment of the encapsulating film from the glass.

In order to secure solar cells in other sections of the production process, retaining devices are known from DE 10 2006 007 447. WO 2008/104596 A1 describes a carrier system which is used in solar module production. However both technologies are not suitable for securing on a stack made of glass and encapsulating material since they cover only isolated solar cells.

For transporting solar cells and solar strings, frequently vacuum- or Bernoulli grippers are used. Such grippers require however free access on one side of the solar cell. Thus for example grippers are used in order to deposit the solar cell or solar cell strings from the top on the stack made of glass and encapsulating material. These grippers cannot however remain there since they would impede soldering processes and the overlaying of further layers, e.g. of a further encapsulating material or a rear-side film.

SUMMARY

Starting herefrom, it was the object of the present invention to provide a securing device which enables simple securing of the solar cells in solar module production.

This object is achieved by the securing device having the features of claim 1 and by the method having the features of claim 6. The further dependent claims reveal advantageous developments.

According to the invention, a securing device for solar cells on glass surfaces is provided, which securing device comprises at least one film which has a large number of holes and also at least one channel which connects the holes, leads to a film edge and has connection openings at the film edges for connection of a device for producing a low pressure. The holes thereby represent interconnected recesses in the film. One design possibility for the channels is embossing troughs in the encapsulating film. The troughs extend from the centre of the cell matrix to the edge thereof so that each individual cell has a connection to the channel system. It is thereby preferred that the film made of the encapsulating material is laid on the glass such that the troughs are open towards the glass side.

A further preferred variant provides that the at least one film, on the first film surface, has at least partially knobs or another raised structure for reducing the contact area between film and solar cell in the regions which are not provided with holes. By means of the embossing of such knobs, the film made of the encapsulating material can be prevented from melting and including air bubbles during soldering. In order that the knobs allow the formation of a low pressure for securing the cell, a raised ring can be structured around the holes.

According to the invention, a method is likewise provided for securing solar cells in the production of solar modules, in which a securing device according to the invention is disposed on a glass surface. By connection of a device for producing a low pressure, a low pressure is produced in the holes, by means of which securing to the glass surface is effected.

The securing device, i.e. the film, has a system of channels and holes which make it possible to secure, in the position thereof, solar cells which are laid down from above by means of grippers. Securing is effected by low pressure which is applied from the side on the edge of the film. The encapsulating film lies at this time already on the front sheet of glass. The method according to the invention prevents the solar cells slipping or deforming after deposition on the stack made of glass and the film made of encapsulating material.

In solar module production, this method reduces the risk of breakage of the solar cells since these are only moved and deposited one single time. Furthermore, the process of module production can be simplified by dispensing with the normal intermediate steps of string production and of string transport. The cells can be connected directly in the secured position, for example by selective soldering or glueing which is effected before or during lamination. After laying down and possibly connecting the cells, a further film made of encapsulating material and/or a rear-side film can be laid thereon. Connection of cells on the film lower layer is suitable in particular for rear contact cells since these must be contacted exclusively via the rear-side.

After deposition of the solar cells, the moveable gripper can be removed without the solar cells changing their position or shape. The further steps of module manufacture, e.g. the electrical connection by selectively soldering or supplementing the layer structure, can be effected on the stack made of glass and encapsulating material.

The securing device according to the invention and the method according to the invention prevent solar cells slipping or deforming after deposition on the stack made of glass and encapsulating material. Hence a particularly gentle processing of solar cells which need be moved only a single time can be effected. Furthermore, the process of module production can be simplified by dispensing with the intermediate steps of string production and of string transport. The solar cells can be connected directly on the stack made of glass and encapsulating material, for example by selective soldering.

The method according to the invention can be used for producing wafer-based solar modules, preferably for the processing of rear contact solar cells.

DETAILED DESCRIPTION

The subject according to the invention is intended to be explained in more detail with reference to the subsequent Figures without wishing to restrict said subject to the specific embodiments shown here.

Figure 1:
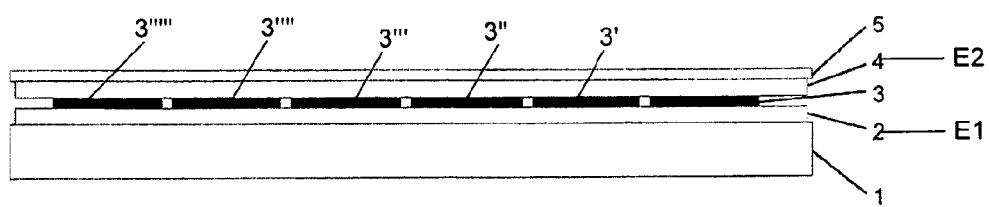
FIG. 1 shows the construction of a solar cell module according to the state of the art.

FIG. 1 shows the construction of a solar cell module according to the state of the art. A film made of an encapsulating material 2 is hereby disposed on a front sheet of glass 1. The solar cells 3 to 3'''' are situated on this film and are in turn covered by a further film made of an encapsulating material 4. A rear-side film 5 is then also disposed on this film.

Figure 2:
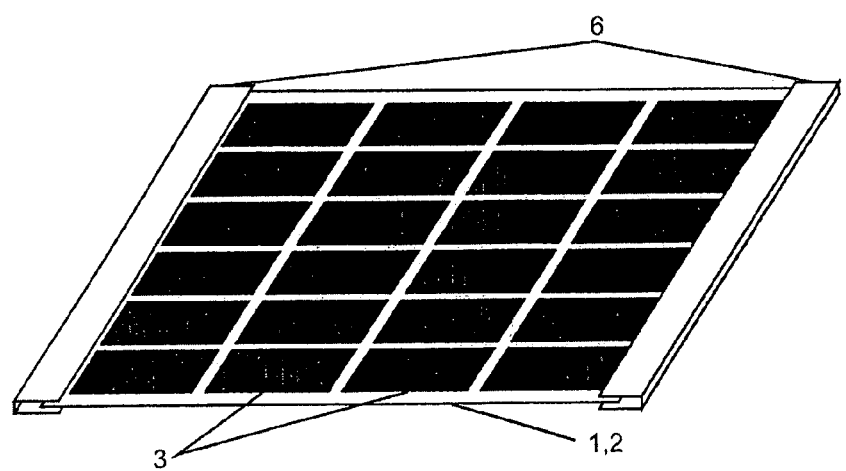
FIG. 2 is a plan view of a solar module according to FIG. 1.

FIG. 2 shows a plan view of such a solar module according to FIG. 1. The individual solar cells 3 are disposed here on the front glass 1 and on the film made of encapsulating material 2. Devices 6 via which air is suctioned in are located at the edges so that a low pressure is produced at the positions of the cell support.

Figure 3:
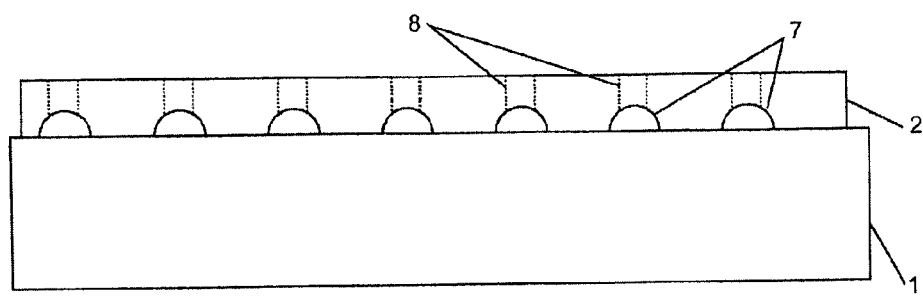
FIG. 3 is a cross-section of a securing device according to the invention.

In FIG. 3, a cross-section of a securing device according to the invention is represented.

The film made of encapsulating material 2 which is disposed on the front glass 1 hereby has channels 7. Furthermore, the film comprises a hole matrix made of holes 8 which allow the passage of air from the side of the troughs to the surface of the film made of encapsulating material which is orientated away from the front glass 1, where the cells are intended to be secured.

Figure 4:
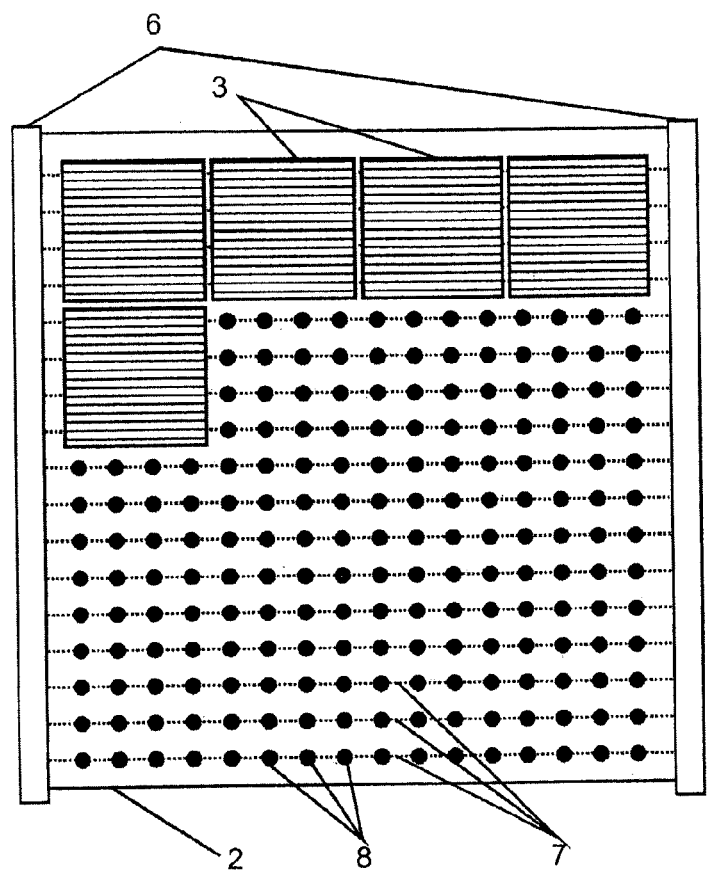
FIG. 4 is a plan view of a securing device according to the invention.

In FIG. 4, a plan view of a securing device according to the invention is represented. Here also, the film made of encapsulating material 2 has channels 7 and a hole matrix made of holes 8. Solar cells 3 are disposed on the film made of encapsulating material 2. At both film edges of the film made of encapsulating material 2, hermetic clamps 6 for air extraction abut at the side so that, in the regions of the film 2 where solar cells 3 are disposed, a low pressure is produced, by means of which the cells are secured on the film.

The invention claimed is:

1. A film for securing solar cells onto glass surfaces comprising an encapsulating material and having a plurality of holes and also at least one channel that connects the holes, that leads to a film edge, and that has connection openings at the film edges for connection of a device for producing a low pressure, wherein the holes extend through the film.

2. The film according to claim 1, wherein the channels are configured in the form of troughs that are open in the direction of the glass surface.

3. The film according to claim 2, wherein the troughs have a cross-sectional area that corresponds to 0.05 to 5 times the square of the film thickness.

4. The film according to claim 1, wherein the device for producing a low pressure is a vacuum pump.

5. The film of claim 1, wherein the plurality of holes define a hole matrix for applying suction to a solar cell positioned on the at least one film opposite the glass surface.

6. The film of claim 1, wherein the film separates the solar cells from the glass surface.

7. A method for securing solar cells in the production of solar modules, in which:
   a) at least one film is disposed on a glass surface, the film having a plurality of holes and also at least one channel that connects the holes, that leads to a film edge, and that has connection openings at the film edges for connection of a device for producing a low pressure in the holes, wherein the holes extend through the film;
   b) at least one solar cell is arranged on the film; and,
   c) a low pressure is produced in the holes of the film by connection of a device for producing a low pressure, by which securing of the at least one solar cell to the glass surface and film is effected.

8. The method according to claim 7, wherein the low pressure is produced with a vacuum pump.

9. The method of claim 7, wherein the channels of the film are configured in the form of troughs which that are open in the direction of the glass surface.

10. The method of claim 9, wherein the film includes the troughs having a cross-sectional area that corresponds to 0.05 to 5 times the square of the film thickness.

11. The method of claim 7, wherein the low pressure produced in the holes applies suction to the at least one solar cell positioned on the film opposite the glass surface.

12. A solar cell module, comprising:
   a glass sheet having a glass surface;
   a film disposed on the glass surface and defining a plurality of holes and at least one channel that connects the holes, each channel extending to a film edge and having a connection opening at the film edge for connection of a device for producing a low pressure in the holes, the channels being open in the direction of the glass surface; and
   at least one solar cell disposed on the film opposite the glass sheet, the plurality of holes being open in the direction of the solar cell to secure the solar cell to the film when a low pressure is produced in the holes.

13. The solar cell module according to claim 12, wherein the channels are configured in the form of troughs that are open in the direction of the glass surface.

14. The solar cell module according to claim 13, wherein the troughs have a cross-sectional area that corresponds to 0.05 to 5 times the square of the film thickness.

15. The solar cell module according to claim 12, wherein the film separates the glass sheet from the at least one solar cell.

* * * * *